United States Patent
Choi et al.

(10) Patent No.: US 10,026,837 B2
(45) Date of Patent: Jul. 17, 2018

(54) EMBEDDED SIGE PROCESS FOR MULTI-THRESHOLD PMOS TRANSISTORS

(71) Applicant: Texas Instruments Incorporated, Dallas, TX (US)

(72) Inventors: Younsung Choi, Allen, TX (US); Deborah J. Riley, Murphy, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/845,112

(22) Filed: Sep. 3, 2015

(65) Prior Publication Data

US 2017/0069755 A1    Mar. 9, 2017

(51) Int. Cl.
| | |
|---|---|
| H01L 29/78 | (2006.01) |
| H01L 29/66 | (2006.01) |
| H01L 29/08 | (2006.01) |
| H01L 29/161 | (2006.01) |
| H01L 27/088 | (2006.01) |
| H01L 21/8234 | (2006.01) |
| H01L 29/165 | (2006.01) |

(52) U.S. Cl.
CPC .. *H01L 29/7848* (2013.01); *H01L 21/823412* (2013.01); *H01L 27/088* (2013.01); *H01L 29/0847* (2013.01); *H01L 29/161* (2013.01); *H01L 29/66492* (2013.01); *H01L 29/66636* (2013.01); *H01L 29/165* (2013.01); *H01L 29/78* (2013.01); *H01L 29/7833* (2013.01)

(58) Field of Classification Search
CPC ....... H01L 21/30604; H01L 21/823807; H01L 29/66492; H01L 29/6656; H01L 29/6659; H01L 29/66636; H01L 29/7848; H01L 29/063; H01L 29/1087; H01L 29/2003; H01L 29/7786
See application file for complete search history.

(56) References Cited

U.S. PATENT DOCUMENTS

| | | | |
|---|---|---|---|
| 2003/0176033 A1* | 9/2003 | Grider | H01L 21/823864 438/231 |
| 2005/0208764 A1* | 9/2005 | Lu | H01L 21/26506 438/655 |
| 2006/0150408 A1* | 7/2006 | Kang | B41J 2/162 29/890.1 |
| 2009/0179236 A1 | 7/2009 | Chakravarthi et al. | |
| 2010/0078689 A1* | 4/2010 | Kronholz | H01L 21/823412 257/288 |

(Continued)

FOREIGN PATENT DOCUMENTS

WO    2015027141 A1    2/2015

*Primary Examiner* — Tom Thomas
*Assistant Examiner* — John Bodnar
(74) *Attorney, Agent, or Firm* — Jacqueline J. Garner; Charles A. Brill; Frank D. Cimino

(57) ABSTRACT

An integrated circuit and method having a first PMOS transistor with extension and pocket implants and with SiGe source and drains and having a second PMOS transistor without extension and without pocket implants and with SiGe source and drains. The distance from the SiGe source and drains to the gate of the first PMOS transistor is greater than the distance from the SiGe source and drains to the gate of the second PMOS transistor and the turn on voltage of the first PMOS transistor is at least 50 mV higher than the turn on voltage of the second PMOS transistor.

11 Claims, 6 Drawing Sheets

(56) References Cited

U.S. PATENT DOCUMENTS

| | | | |
|---|---|---|---|
| 2013/0228826 A1* | 9/2013 | Wang | H01L 21/823807 257/192 |
| 2013/0248949 A1* | 9/2013 | Kirkpatrick | H01L 21/823864 257/288 |
| 2014/0346565 A1 | 11/2014 | Wei et al. | |
| 2015/0031178 A1 | 1/2015 | Riley et al. | |
| 2015/0069466 A1* | 3/2015 | Chang | H01L 21/30608 257/192 |
| 2015/0214116 A1 | 7/2015 | Javorka et al. | |

* cited by examiner

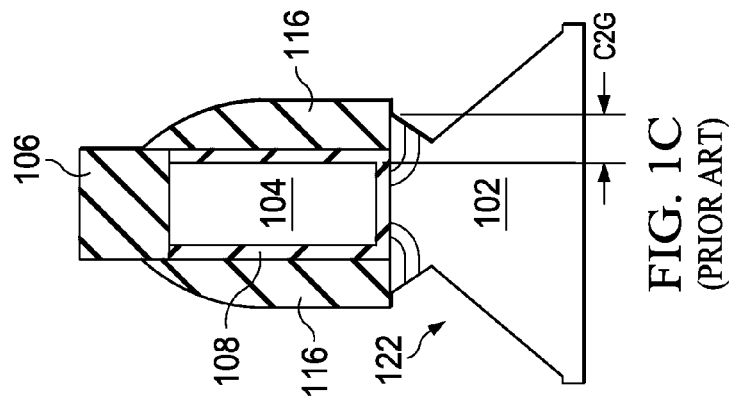
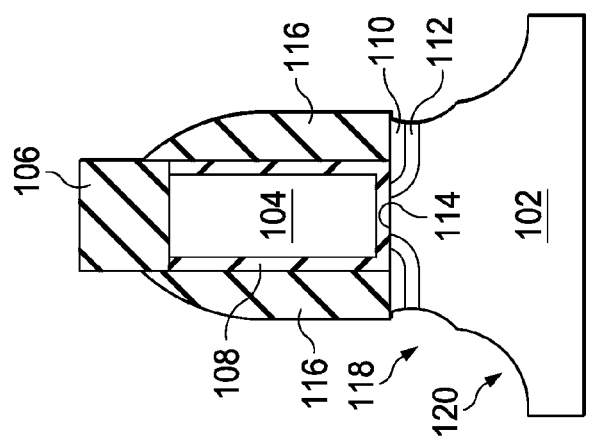
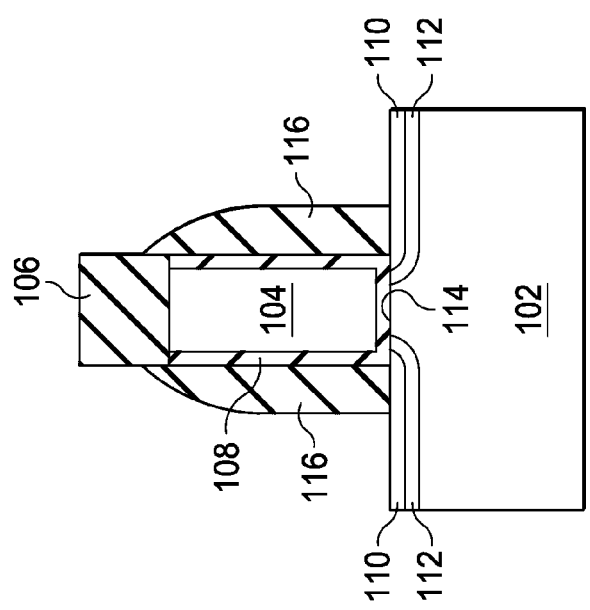

US 10,026,837 B2

EMBEDDED SIGE PROCESS FOR MULTI-THRESHOLD PMOS TRANSISTORS

FIELD OF THE INVENTION

This invention relates to the field of integrated circuits. More particularly, this invention relates to PMOS transistors with silicon germanium source and drain diffusions.

BACKGROUND

Techniques to embed SiGe source/drain regions have been used for CMOS devices to increase compressive stress in the channel region of PMOS devices to improve device performance by improving hole mobility. In such process flows, following gate stack and source/drain extension formation, a cavity is formed in the source/drain regions of the PMOS device. Cavity formation is generally accomplished by a multi-step dry etch process, followed by a wet etch process.

The first dry etch step is a first anisotropic dry etch used to etch through a deposited hardmask layer (e.g., silicon nitride) to begin etching of a cavity in the substrate (e.g., silicon), followed by an isotropic dry lateral etch (dry lateral etch) that expands the cavity including laterally toward the PMOS transistor channel, followed by a second anisotropic dry etch to define the bottom wall of the cavity.

The multi-step dry etch is generally followed by a wet crystallographic etch which forms a "diamond-shaped" cavity. The wet etchant for the crystallographic etch has crystal orientation selectivity to the substrate material, such as an etchant comprising tetramethyl ammonium hydroxide (TMAH), which is used to etch the substrate beginning with the U-shaped recesses provided by the multi-step dry etch processing. During the wet crystallographic etching process, the etch rate of the <111> crystal orientation is less than that of other crystal orientations such as <100>. As a result, the U-shaped recess becomes a diamond-shaped recess.

FIG. 1A is a depiction showing an in-process PMOS transistor just prior to the formation of SiGe (silicon germanium) source and drain diffusions. The PMOS transistor is shown having a gate stack including a gate electrode 104 on a substrate 102 such as silicon, with a sidewall spacer 116 on the walls of the gate stack and a hard mask layer (e.g., silicon nitride) 106 on the gate electrode 104. P-type source and drain extensions 110 and n-type halo or pockets 112 are formed self aligned to an offset spacer 108 dielectric such as silicon dioxide or silicon nitride. The p-type extensions 110 electrically connect the PMOS transistor channel to the deep source drains to which contacts are formed. The n-type pockets 112 increase the doping in the PMOS transistor channel 114 and set the PMOS transistor turn on voltage (vtp).

FIG. 1B shows the PMOS transistor immediately after completing multi-step dry cavity etch processing. Typically the first dry etch step is a first anisotropic dry etch used to etch through a deposited hardmask layer (eg. silicon nitride) and to begin etching a cavity into the substrate 102. This is followed by an isotropic dry lateral etch step that expands the cavity laterally 118 toward the PMOS transistor channel 114. This etch is typically followed by a second anisotropic dry etch to define the bottom wall of the cavity 120.

FIG. 1C shows a depiction of an in-process PMOS transistor after the wet crystallographic cavity etch forms diamond-shaped recesses 122. The C2G (cavity to gate space) is the distance from the edge of the cavity to the edge of the transistor gate.

Following the wet crystallographic etch, boron doped SiGe is grown epitaxially in the diamond-shaped recesses to form the PMOS embedded SiGe source/drain regions. The embedded SiGe regions are spaced close enough to the outer edge of the PMOS transistor channel so that they impart a high amount of compressive stress to the channel. However, the SiGe regions are not too close to the outer edge of the PMOS transistor channel so that dopant diffusion from the in-situ doping in the SiGe runs into the PMOS channel and alters the PMOS threshold voltage (vtp).

Integrated circuits often require PMOS transistors with a low turn on voltage (LVPMOS) for high performance circuits in addition to the core PMOS transistors. Typically one pattern and implantation step is used to set the vt of the core PMOS transistors and a second pattern and implantation step is used to set the lower vtp of the LVPMOS transistors.

SUMMARY

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit is formed with a first PMOS transistor with extension and pocket implants and with SiGe source and drains and with a second PMOS transistor without extension and without pocket implants and with SiGe source and drains. The distance from the SiGe source and drains to the gate of the first PMOS transistor is greater than the distance from the SiGe source and drains to the gate of the second PMOS transistor. The turn on voltage of the first PMOS transistor is higher than the turn on voltage of the second PMOS transistor. A method for forming an integrated circuit with a first PMOS transistor with extension and pocket implants and with SiGe source and drains and with a second PMOS transistor without extension and without pocket implants and with SiGe source and drains. The distance from the SiGe source and drains to the gate of the first PMOS transistor is greater than the distance from the SiGe source and drains to the gate of the second PMOS transistor and the turn on voltage of the first PMOS transistor is higher than the turn on voltage of the second PMOS transistor.

DESCRIPTION OF THE VIEWS OF THE DRAWINGS

FIG. 1A-1C are cross-sections of the formation of SiGe source and drains on a PMOS transistor.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

For the purposes of this description, the term "C2Gd" refers to the SiGe cavity to gate space for a PMOS transistor with extension and pocket doping. The term "C2Gu" refers to the SiGe cavity to gate space for a LVPMOS transistor without extension and pocket doping (undoped).

Figure 2A:
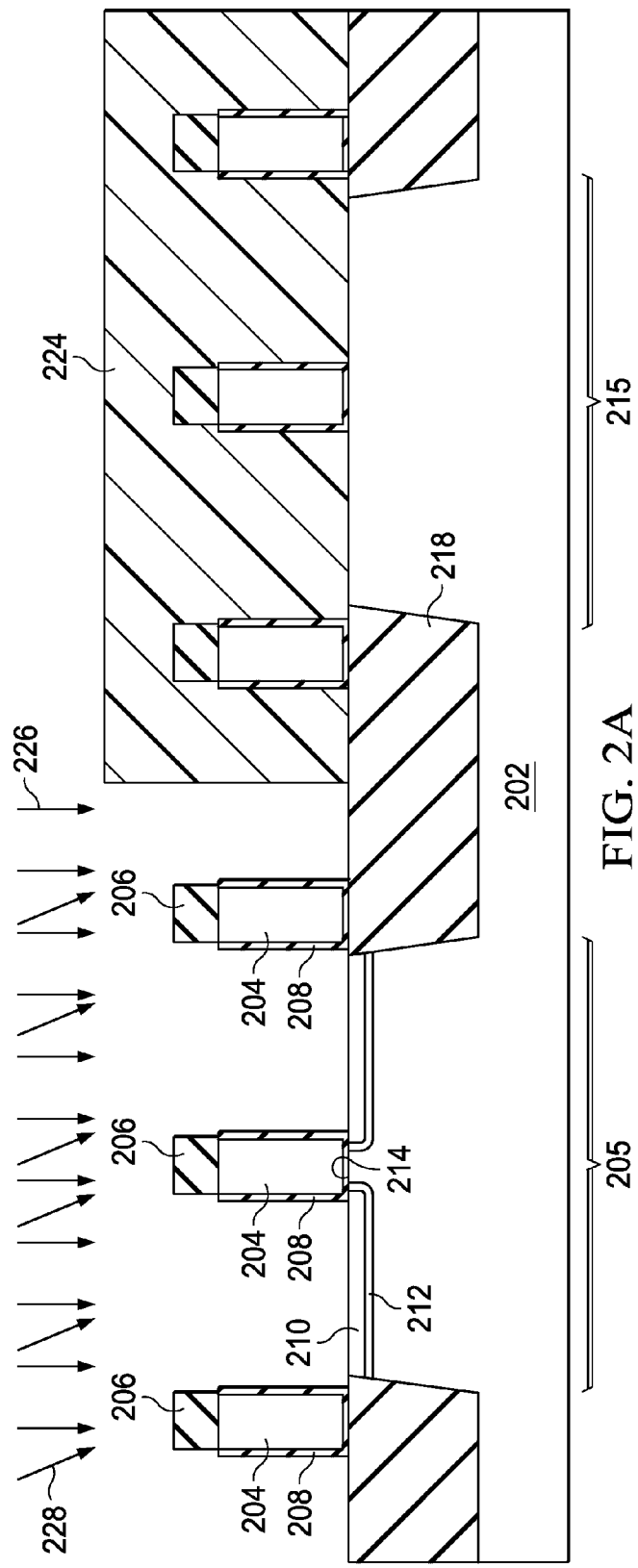
FIG. 2A through FIG. 2E are cross sections of an integrated circuit with an embodiment low voltage PMOS transistor depicted in successive stages of fabrication.
Figure 2B:
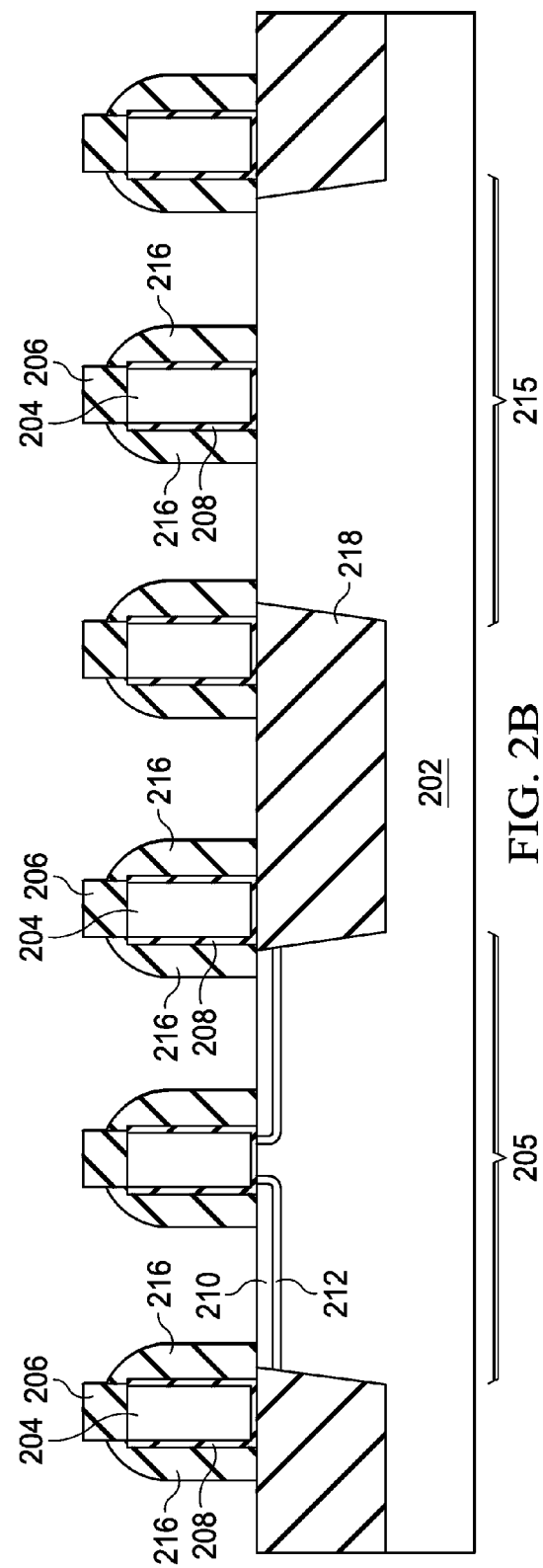
Figure 2C:
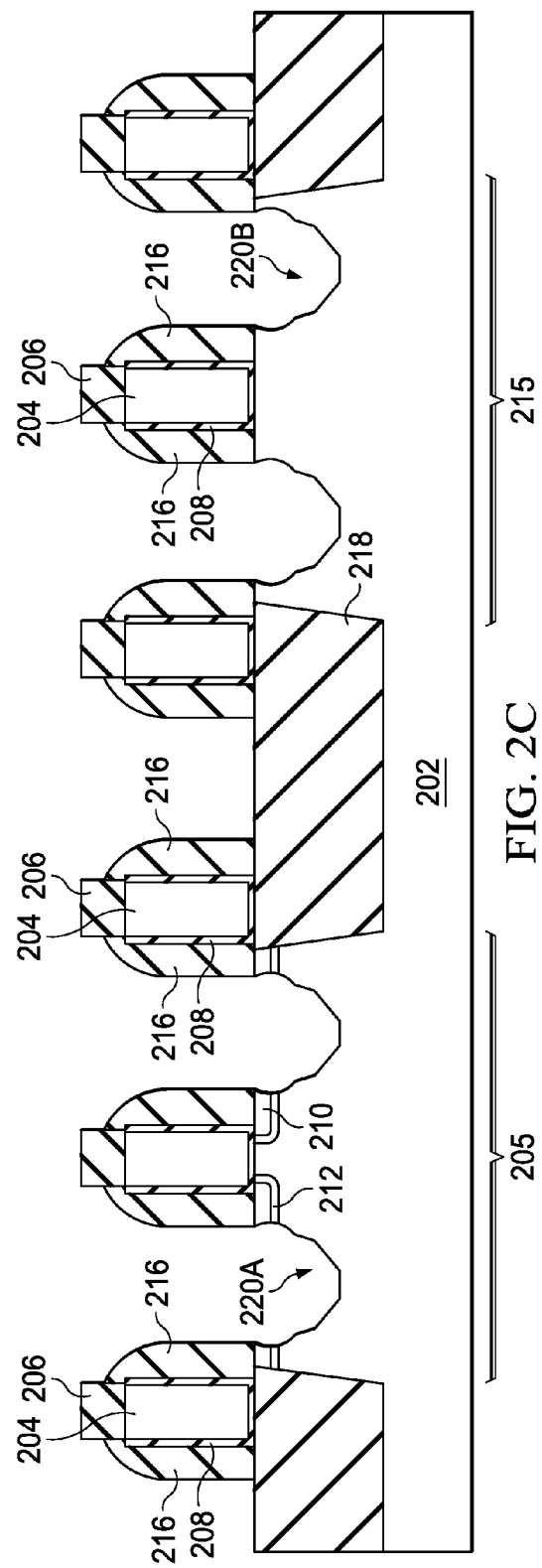
Figure 2D:
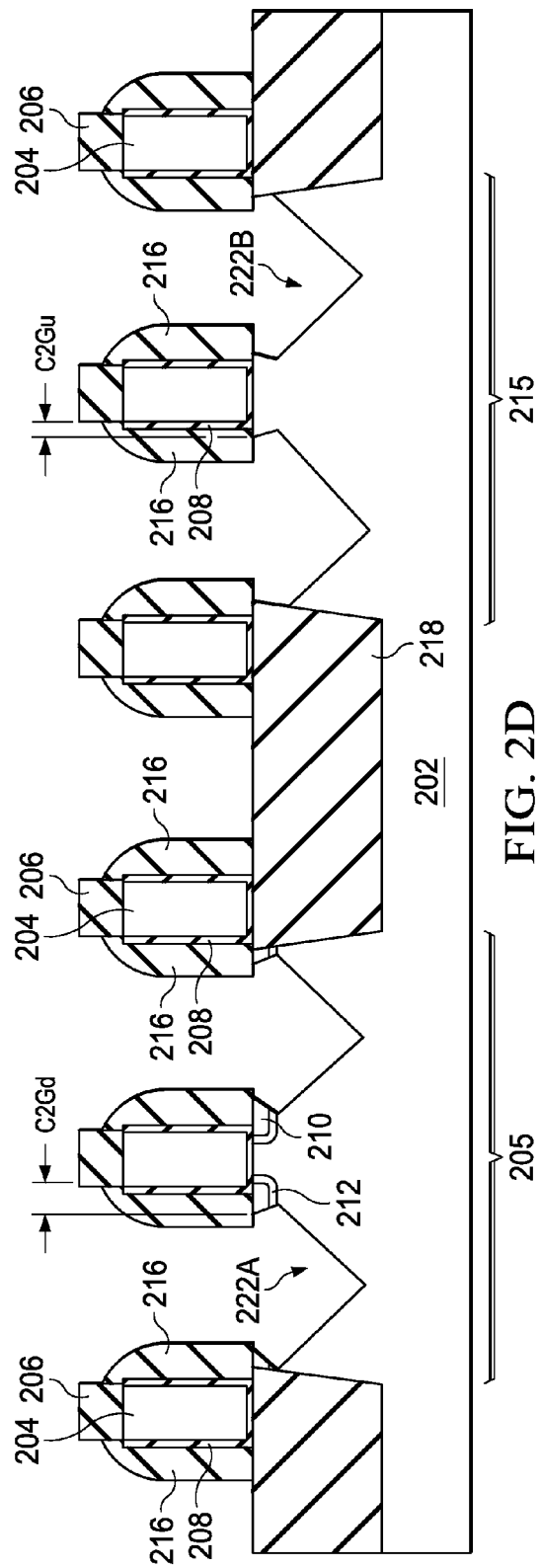
Figure 2E:
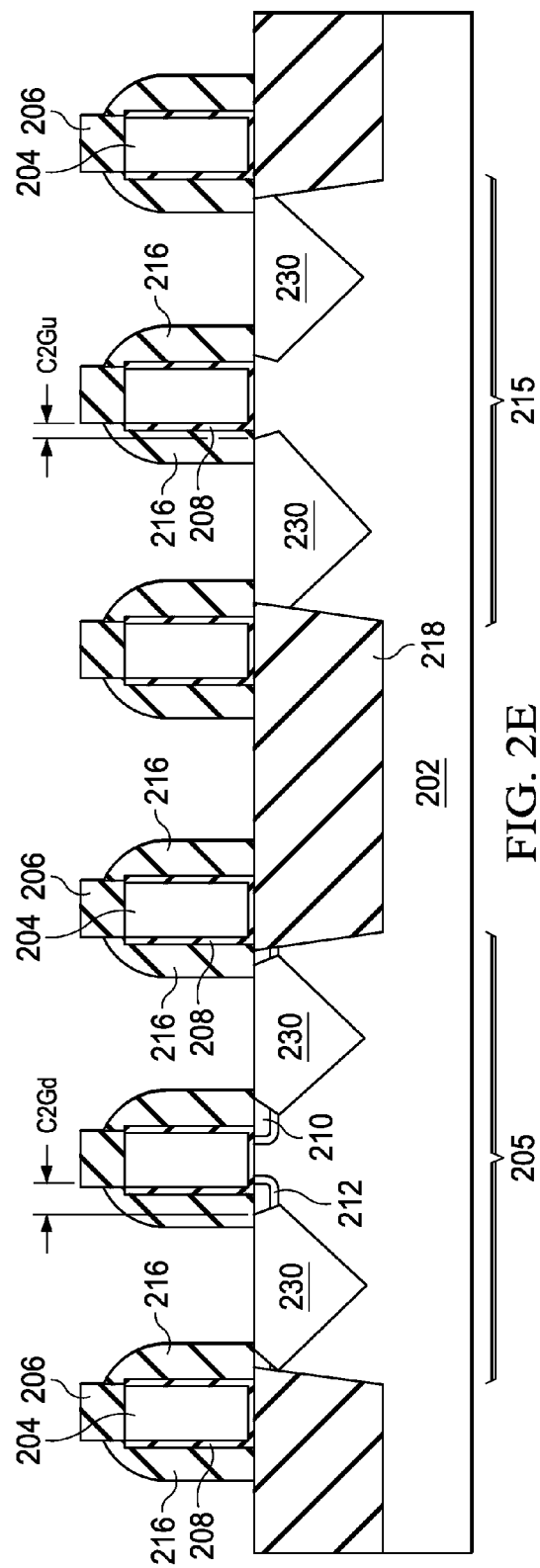

A portion of an integrated circuit with a core PMOS 205 and low voltage PMOS (LVPMOS) 215 transistor with SiGe source and drains formed according to embodiments of this invention is shown in FIG. 2E. The LVPMOS transistor 215 with a lower vtp is formed with no additional lithography or implantation steps. The core PMOS transistor 205 has source and drain extensions 210 and pockets 212. The LVPMOS transistor 215 does not have source and drain extensions and does not have pockets. In addition the SiGe cavity to gate space (C2Gd) on the core PMOS transistor is greater than the SiGe cavity to gate space (C2Gu) of the LVPMOS transistor. The lack of pocket doping and the smaller SiGe cavity to gate space on the LVPMOS transistor results in a transistor with a lower turn on voltage. The smaller cavity SiGe to gate space on the LVPMOS transistor also enables the source and drain diffusions of the LVPMOS transistor to electrically connect to the transistor channel without increased series resistance.

A method for forming a core PMOS transistor and a LVPMOS transistor with SiGe source and drain diffusions using only one extension pattern and implantation step is illustrated in steps in an integrated circuit manufacturing flow depicted in FIGS. 2A through 2E.

FIG. 2A shows a cross section through PMOS transistor gates 204 in an integrated circuit. PMOS transistor gates 204 with a dielectric capping layer 206 are formed on an n-type substrate 202. The n-type substrate may be an nwell formed in a p-type substrate. Shallow trench isolation (STI) 218 electrically isolates the core PMOS transistor 205 from the LVPMOS transistor 215. A core PMOS extension photoresist pattern 224 is formed on the integrated circuit blocking the extension implant 226 and the pocket implant 228 from the LVPMOS transistor 215 and opening the core PMOS transistor 205 to the extension 226 and pocket 228 implants. The p-type extension implant 226 may be self-aligned to an offset spacer 208 (dielectric such as $SiO_2$ or $Si_3N_4$) forming the core PMOS source and drain extensions 210. The n-type halo or pocket implant 228 may be implanted self-aligned to an offset spacer 208 to adjust the doping of the core PMOS transistor channel 114 to set the turn on voltage (vtp). After performing the extension and halo implants, photoresist pattern 224 is removed.

FIG. 2B shows the integrated circuit after SiGe spacer sidewalls 216 are formed on the PMOS transistor gates 204. The SiGe spacer sidewalls 216 and the dielectric capping layer 206 completely enclose the gate 204 to prevent epitaxial growth of SiGe on the gate 204 material. In an example embodiment the SiGe spacer sidewalls are about 20 nm of silicon nitride.

FIG. 2C shows the integrated circuit after a multi-step dry etch forms the U-shaped cavities 220A (for the core PMOS transistor 205) and 220B (for the LVPMOS transistor 215) in the substrate 202. For example, the first dry etch step may be a first anisotropic dry etch used to etch through a deposited hardmask layer (eg. silicon nitride) and to begin etching the cavities 220A and 220B into the substrate 202. This may be followed by an isotropic dry lateral etch step that expands the cavity laterally toward the channel. This etch may be followed by a second anisotropic dry etch to define the bottom wall of the cavities 220A and 220B. At this point, U-shaped cavities 220A and 220B are both similarly aligned to the spacers 216.

As shown in FIG. 2D, a wet crystallographic etch is used to etch along crystallographic planes in the substrate 202 to produce "diamond-shaped" cavities 222A and 222B. The wet etchant for the crystallographic etch has crystal orientation selectivity to the substrate material, such as an etchant comprising tetramethyl ammonium hydroxide (TMAH), which is used to etch the substrate beginning with the U-shaped recesses 220A and 220B (FIG. 2C) provided by the multi-step dry etch processing. During the wet crystallographic etching process, the etch rate of the <111> crystal orientation is less than that of other crystal orientations such as <100>. As a result, the U-shaped recesses 220A and 220B become diamond-shaped.

Because boron doping retards the wet crystallographic etch, the lightly doped silicon (no extension and pocket implant) where the LVPMOS 215 transistor is being formed etches faster than the silicon by PMOS transistor 205 that is more heavily doped by the extension implant 226. As a result, cavity 220B extends further under spacers 216 than cavity 220A at the surface/top of the cavities. In an example embodiment with a sidewall 216 thickness of about 20 nm and a boron extension doping of 1.2 $E14/cm^2$, the cavity to gate space (C2Gu) with the lightly doped substrate on the LVPMOS transistor 215 is about 5 nm compared to 15 nm for the cavity to gate space (C2Gd) with the boron doped extension on the core PMOS transistor 205. The smaller C2Gu on the LVPMOS transistor enables the p-type SiGe to connect to the LVPMOS transistor 215 channel without an extension implant. In addition, since the SiGe will be closer to the transistor channel on the LVPMOS transistor 215 the stress is increased additionally improving the performance of the LVPMOS transistor. The combination of the SiGe being closer to the transistor channel plus the lack of a pocket implant lowers the turn on voltage of the LVPMOS transistor. In an example embodiment the turn on voltage of the LVPMOS transistor 215 is about 200 mV lower than the turn on voltage of the core PMOS transistor 205.

Referring now to FIG. 2E, p-doped SiGe 230 is epitaxially grown to fill the diamond shaped cavities 222A and 222B on the core PMOS 205 and LVPMOS 215 transistors, respectively. The p-doped SiGe is sufficiently close (C2Gu) to the channel of the LVPMOS transistor to electrically connect the p-type SiGe to the channel of the LVPMOS transistor 215 without a p-type extension implant whereas the p-type doped SiGe is too far (C2Gd) from the channel of the core PMOS transistor to form an electrical connection. Additional processing to add deep source and drain diffusions, silicide, contacts, interconnect levels may then be performed to complete the integrated circuit.

If desired, dopant may be implanted at low energy to fine tune the LVPMOS transistor 215 turn on voltage when the nwell dopant is implanted.

Core PMOS 205 and LVPMOS 215 transistors with SiGe source and drains are simultaneously formed using only one extension and pocket patterning and implantation step. This saves significant cost and cycle time over the conventional method which requires separate patterning and implantation steps for the core PMOS 205 and LVPMOS 215 transistors.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A process of forming an integrated circuit, comprising the steps:
    forming a first PMOS transistor gate of a first PMOS transistor with source and drain extension implants and with pocket implants self-aligned to the first PMOS transistor gate;
    forming a second PMOS transistor gate without source and drain extension implants and without pocket implants;
    forming SiGe spacer sidewalls on the first and second PMOS transistor gates;
    dry etching first U-shaped cavities self-aligned to the SiGe spacer sidewalls in source and drain regions of the first PMOS transistor and second U-shaped cavities self-aligned to the SiGe spacer sidewalls in source and drain regions of the second PMOS transistor;
    converting the first and second U-shaped cavities to first and second diamond shaped cavities, respectively, using a wet crystallographic etch where the distance from the first diamond shaped cavity to the gate of the first PMOS transistor is greater than the distance from the second diamond shaped cavity to the gate of the second PMOS transistor; and
    wherein a turn on voltage of the first PMOS transistor is at least 50 mV higher than a turn on voltage of the second PMOS transistor.

2. The process of claim 1, wherein the turn on voltage of the first PMOS transistor is about 200 mV higher than the turn on voltage of the second PMOS transistor.

3. The process of claim 1, wherein the SiGe spacer sidewalls are approximately 20 nm.

4. The process of claim 1, wherein the SiGe spacer sidewalls are approximately 20 nm and where the distance from the first diamond shaped cavity to the gate of the first PMOS transistor is approximately 15 nm and wherein the distance from the second diamond shaped cavity to the gate of the second PMOS transistor is approximately 5 nm.

5. The process of claim 1, wherein the wet crystallographic etch uses tetramethyl ammonium hydroxide.

6. A process of forming an integrated circuit, comprising:
    forming a first PMOS gate of a first PMOS transistor and a second PMOS gate of a second PMOS transistor;
    forming a photoresist pattern exposing an area for the first PMOS transistor and covering an area for the second PMOS transistor;
    using the photoresist pattern, implanting source and drain extension regions in the first PMOS transistor without implanting source and drain extension regions in the second PMOS transistor;
    using the photoresist pattern, implanting pocket regions in the first PMOS transistor without implanting pocket region into the second PMOS transistor;
    removing the photoresist pattern;
    forming SiGe spacer sidewalls on the first and second PMOS gates;
    without forming source and drain extension regions in the second PMOS transistor, forming a first SiGe cavity in the first PMOS transistor and a second SiGe cavity in the second PMOS transistor, wherein a first SiGe cavity to gate spacing of the first PMOS transistor is greater than a second SiGe cavity to gate spacing of the second PMOS transistor;
    wherein a turn on voltage of the first PMOS transistor is at least 50 mV higher than a turn on voltage of the second PMOS transistor.

7. The process of claim 6, wherein the turn on voltage of the first PMOS transistor is about 200 mV higher than the turn on voltage of the second PMOS transistor.

8. The process of claim 6, wherein the SiGe spacer sidewalls are about 20 nm.

9. The process of claim 6, wherein the SiGe spacer sidewalls are approximately 20 nm and where the first SiGe cavity to gate spacing is approximately 15 nm and wherein the second SiGe cavity to gate spacing is approximately 5 nm.

10. The process of claim 6, wherein the first SiGe cavity and the second SiGe cavity are diamond shaped and are formed by:
    dry etching first U-shaped cavities self-aligned to the SiGe spacer sidewalls in source and drain regions of the first PMOS transistor and second U-shaped cavities self-aligned to the SiGe spacer sidewalls in source and drain regions of the second PMOS transistor; and
    performing a wet crystallographic etch to convert the first and second U-shaped cavities to first and second diamond shaped cavities, respectively, wherein the wet crystallographic etch laterally etches the second U-shaped cavity faster than the first U-shaped cavity at the surface to form the first SiGe cavity to gate spacing of the first PMOS transistor greater than the second SiGe cavity to gate spacing of the second PMOS transistor.

11. The process of claim 10, wherein the wet crystallographic etch uses tetramethyl ammonium hydroxide.

* * * * *